United States Patent [19]

Nakayama et al.

[11] Patent Number: 5,538,771
[45] Date of Patent: Jul. 23, 1996

[54] SEMICONDUCTOR WAFER-SECURING ADHESIVE TAPE

[75] Inventors: Koji Nakayama, Hiratsuka; Kenji Mougi, Atsugi; Eiji Shiramatsu, Kitakyushu; Kazushige Iwamoto; Shinichi Ishiwata, both of Hiratsuka; Morikuni Hasebe, Fujisawa, all of Japan

[73] Assignee: Furukawa Electric Co., Ltd., Tokyo, Japan

[21] Appl. No.: 106,998

[22] Filed: Aug. 17, 1993

Related U.S. Application Data

[63] Continuation-in-part of Ser. No. 904,962, Jun. 26, 1992, abandoned.

[30] Foreign Application Priority Data

| Jun. 28, 1991 | [JP] | Japan | 3-185397 |
| Mar. 18, 1992 | [JP] | Japan | 4-092093 |
| Mar. 18, 1992 | [JP] | Japan | 4-092094 |
| Mar. 18, 1992 | [JP] | Japan | 4-113928 |

[51] Int. Cl.$^6$ ................. B32B 7/12
[52] U.S. Cl. ............. 428/41.3; 428/345; 428/352; 428/353; 428/354; 428/476.3; 428/476.9; 428/519; 428/520; 428/521; 525/98; 525/314
[58] Field of Search ............... 428/40, 345, 352, 428/353, 354, 520, 519, 476.3, 476.9, 476.1, 913, 515, 516, 517, 521, 523; 525/314, 98

[56] References Cited

U.S. PATENT DOCUMENTS

| 4,913,960 | 4/1990 | Kuroda et al. | 428/345 |
| 4,999,242 | 3/1991 | Ishiwata et al. | 428/345 |
| 5,071,686 | 12/1991 | Genske | 428/345 |

FOREIGN PATENT DOCUMENTS

| 2215528 | 8/1990 | Japan . |
| 255739 | 10/1990 | Japan . |

OTHER PUBLICATIONS

Derwent Publications Ltd., Abstract 096638 of JP-A-2 215528 (Aug. 1990).

Derwent Publications, Ltd., Abstract 032543 of JP-A-1 309 206 (Dec. 1989).

*Primary Examiner*—Nasser Ahmad
*Attorney, Agent, or Firm*—Birch, Stewart, Kolasch & Birch

[57] ABSTRACT

There is disclosed a semiconductor wafer-securing adhesive tape having a radiation-curable adhesive layer on one surface of a support film, wherein the support film is composed of a laminated film that comprises, as a center layer, a film comprising a styrene/ethylene/butene/styrene block copolymer, a ethylene/acrylic acid-type copolymer, and a polyamide/polyether copolymer in a specific ratio, and has a layer for adhesive coating laid, directly or through a bonding layer, on one surface of the center layer on the side where said radiation-curable adhesive layer is provided, and has a transfer-preventing layer laid, directly or through a bonding layer, on the other surface of the center layer. There is also disclosed a semiconductor wafer-securing adhesive tape wherein the center layer of said semiconductor wafer-securing adhesive tape has a film comprising said SEBS block copolymer or SEPS block copolymer, an amorphous poly α-olefin, and a polyamide/polyether copolymer, in a specific ratio.

10 Claims, 1 Drawing Sheet

SEMICONDUCTOR WAFER-SECURING ADHESIVE TAPE

This is a continuation-in-part application of U.S. patent application Ser. No. 07/904,962, filed on Jun. 26, 1992, now abandoned.

FIELD OF THE INVENTION

The present invention relates to an adhesive tape that is used in a production line of various semiconductors, and more particularly to a radiation-curable adhesive tape for securing semiconductor wafers that is used, for example, when a wafer having circuit patterns formed thereon is cut into the individual patterns, thereby forming separate semiconductor chips.

BACKGROUND OF THE INVENTION

Hitherto, to carry out dicing for cutting a semiconductor wafer having circuit patterns formed thereon into separate chips, a system that uses a radiation-curable adhesive tape has been developed.

A process for producing semiconductor chips from a wafer, for example, comprises the steps of (1) dicing (a wafer is secured by a strong adhesive force of adhesive tape and, then is cut into separate chips), (2) irradiation (the film side of the base is irradiated with radiation, to lower the adhesive force of the adhesive tape), (3) expanding (the adhesive tape is radially expanded, to enlarge the interval between chips), and (4) picking up (each chip is picked up from the surface of the tape using a collet by vacuum suction and sticking up the tape from the back side of the tape).

Further, there is a process that the expanding (3) is carried out between the steps of dicing (1) and irradiation (2).

In this system, as the adhesive tape, an adhesive tape for securing a semiconductor wafer is used that is made up of a support film through which radiation, such as light, including ultraviolet rays or ionizing radiation, such as an electron beam, can transmit, and an adhesive layer that is coated on the support film, which layer is characteristically curable by exposure to radiation. In this system, the adhesive force of the adhesive tape for securing chips in the dicing step is kept high, and after the semiconductor wafer is cut and separated into chips by the irradiation step, the adhesive force is lowered. Namely, after the cutting and separation into chips, the film side of the support is irradiated with radiation, to cure the radiation-curable adhesive layer, thereby lowering considerably the chip-securing adhesive force, so that, irrespective of the size of the chips, even chips having a size, for example, of 25 mm$^2$ or over, can easily be picked up. This is because a radiation-curable compound contained in the adhesive layer of the semiconductor wafer-securing adhesive tape, which tape is formed by applying a radiation-curable adhesive on a support film through which radiation can be transmitted, is cured by irradiation with radiation, to cause the adhesive to take on a three-dimensional structure, thereby lowering the fluidity of the adhesive remarkably.

However, due to the three-dimensional structure, the rubber-like elasticity of the adhesive tape possessed at the time of dicing is eventually almost lost at the time of expanding after the curing. Consequently, a problem arises that the conventionally performed enlargement of the intervals between chips by radial expanding of the adhesive tape becomes difficult.

To solve the problem, the use of a soft polyvinyl chloride (PVC) as a central layer in a support film has already been put into practice. However, as polyvinyl chloride resins contain chlorine and further contain stabilizers, including metal compounds, and plasticizers, on some occasions chlorine ions, metal ions, plasticizers, and the like bleed, causing the surface of semiconductor wafers to be contaminated.

Therefore, as disclosed in Japanese Patent Application (OPI) No. 215528/1990, adhesive tapes are suggested, which use a support film comprising a laminated film having a center layer made of a thermoplastic resin with rubber-like elasticity, such as a polybutene-1, a polyurethane, a polyester elastomer, a 1,2-polybutadiene, a hydrogenated styrene/isoprene/styrene copolymer, and a styrene/ethylene/butene/styrene (SEBS) copolymer. However, although all of these adhesive tapes can be enlarged by expanding before the irradiation with radiation, to secure intervals between chips to only prevent contact of the chips, the following problems arise. It is the case that large and uniform intervals between chips are required for a picking-up apparatus involving image recognition after irradiation with radiation. However, none of above prior adhesive tapes satisfies this need sufficiently, because such problems arise as the occurrence of necking of the support film itself (the occurrence of partial extension due to failure of transmission of power at the time of expanding of the film), and the loss of rubber-like elasticity resulting from deterioration of the support film due to the irradiation with radiation.

Considering the above-mentioned polymers individually, a polybutene-1, a polyester elastomer, and a 1,2-polybutadiene are liable to result in necking, thereby making impossible the enlargement of intervals between chips (like PVC); a polyurethane is too high in rubber-like elasticity, thereby leading to a lack of uniformity of intervals between chips; and, although hydrogenated styrene/isoprene/styrene copolymers have preferable properties over the above polymers, they still cannot obviate the problem of necking, and they are attended with the defect that the expansion between chips is unsatisfactory. In Japanese Patent Application (OPI) No. 215528/1990, as a styrene/ethylene/butene/styrene (SEBS) copolymer, RABALON, manufactured by Mitsubishi Petrochemical Co., Ltd., is used in an Example, but Rabalon is blends of SEBS having a molecular weight of 100,000 or more with a polypropylene or ethylene/propylene/diene copolymers, and a compatibilizing agent bleeds into the adhesive layer, thereby making the adhesive force unstable, leading to such problems as the occurrence of picking-up failure and contamination of the wafer. Further, in the case wherein only SEBS is used instead of its blend, in the center layer, depending on the content of styrene and the molecular weight, such problems arise as, for example, necking causes insufficient intervals between chips. There may occur an insufficient lowering of the adhesive force after irradiation due to the poor transmission of radiation.

SUMMARY OF THE INVENTION

The object of the present invention is to provide a semiconductor wafer-securing adhesive tape that is free from the above problems.

That is, an object of the present invention is to provide a semiconductor wafer-securing adhesive tape, wherein the adhesive tape has an adhesive force high enough to secure a semiconductor wafer before irradiation with radiation, which adhesive force for securing chips can be remarkably reduced after irradiation with radiation; the adhesive tape after irradiation with radiation retains its rubber-like elasticity (flexibility); and the expanding of the adhesive tape after irradiation with radiation can sufficiently and uniformly enlarge intervals between chips.

Another object of the present invention is to provide a semiconductor wafer-securing adhesive tape wherein fibrous swarf or the like does not occur at the dicing of the semiconductor wafer, and the adhesive of the adhesive tape does not contaminate the semiconductor chips.

A further object of the present invention is to provide a semiconductor wafer-securing adhesive tape wherein the tape has good interlaminar strength that can reduce a failure of picking up of chips caused by a partial ply separation of support film at the expanding of the tape, and the tape has good heat-resistance that does not cause the breaking of support film.

In a broader sense the object of the present invention is to provide a semiconductor wafer-securing adhesive tape that is adaptable for wide-ranging uses.

The above and other objects, features, and advantages of the invention will become apparent in the following description, taken in connection with the accompanying drawings.

DETAILED DESCRIPTION OF THE INVENTION

Figure 1:
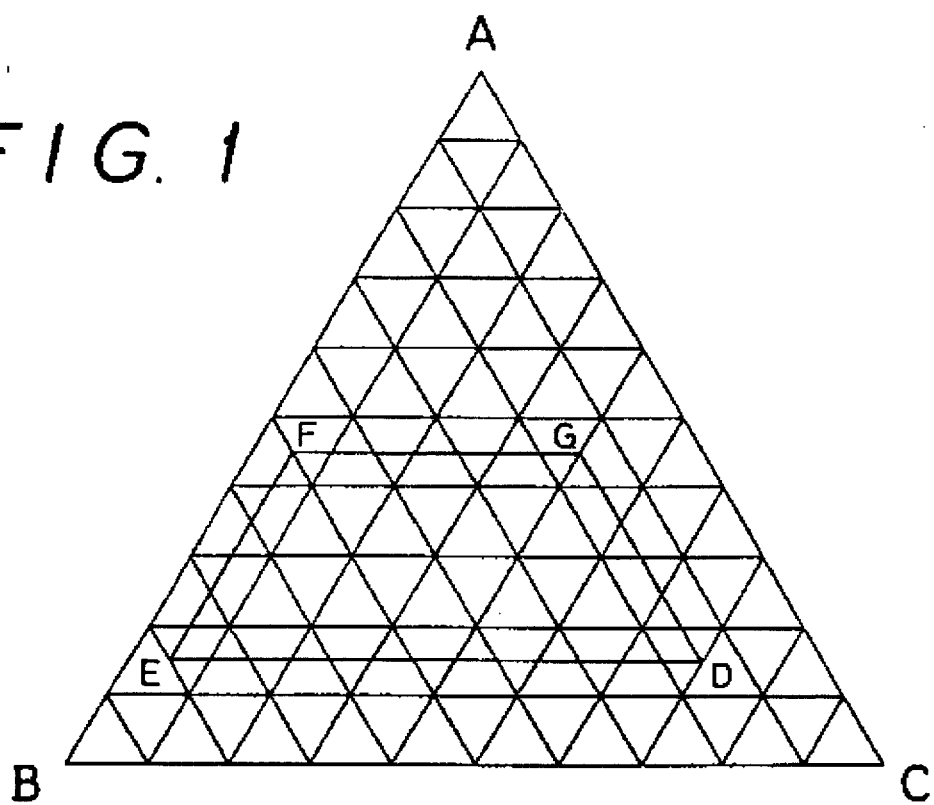
FIG. 1 and FIG. 2 each are triangular coordinate diagrams showing the constituent range of resin composition forming the center layer of support film of adhesive tape of this invention.

The present semiconductor wafer-securing adhesive tape comprises:

(1) a semiconductor wafer-securing adhesive tape having a radiation-curable adhesive layer on one surface of a support film, wherein the support film is composed of a laminated film that comprises, as a center layer, a film comprising 15 to 45 wt % of a styrene/ethylene/butene/styrene block copolymer or a styrene/ethylene/pentene/styrene block copolymer, 15 to 80 wt % of ethylene/acrylic acid-type copolymer, and 5 to 70 wt % of polyamide/polyether copolymer; and has a layer composed of an ethylene series resin for adhesive coating laid, directly or through a bonding layer, on one surface of the center layer on the side where said radiation-curable adhesive layer is provided and has a transfer-preventing layer composed of an ethylene series resin laid, directly or through a bonding layer, on the other surface of the center layer (First embodiment).

(2) a semiconductor wafer-securing adhesive tape as stated in (1) above, wherein the center layer is a film that comprises 15 to 45 wt % of a styrene/ethylene/butene/styrene block copolymer or a styrene/ethylene/pentene/styrene block copolymer, 10 to 45 wt % of an amorphous poly α-olefin, and 20 to 70 wt % of a polyamide/polyether copolymer (Second embodiment), and (3) a semiconductor wafer-securing adhesive tape as stated in (1) above, wherein the center layer is a film that comprises 15 to 45 wt % of a styrene/ethylene/butene/styrene block copolymer or a styrene/ethylene/pentene/styrene block copolymer, 15 to 50 wt % of an ethylene/acrylic acid-type copolymer, 3 to 30 wt % of an amorphous poly α-olefin, and 20 to 70 wt % of a polyamide/polyether copolymer (Third embodiment).

In this specification and the claims, the term "adhesive tape" means a pressure-sensitive adhesive tape, and the term "adhesive" means a pressure-sensitive adhesive. Further, the term "radiation" refers to light, such as ultraviolet rays, or ionizing radiation, such as an electron beam.

Now, the present invention is described in detail.

According to the first embodiment of the present invention, the center layer film comprises resin composition of 15 to 45 wt % of a styrene/ethylene/butene/styrene (SEBS) block copolymer or styrene/ethylene/pentene/styrene (SEPS) block copolymer, 15 to 80 wt % of an ethylene/acrylic acid-type copolymer, and 5 to 70 wt % of a polyamide/polyether copolymer.

In this embodiment, excellent effects can be attained, wherein the fibrous swarfs are not generated at the dicing; and the adhesive force is high enough to secure a semiconductor wafer, and the adhesive force is reduced after irradiation with radiation, with flexibility retained. Further, other effects can be attained, wherein the failure of picking up of chips is reduced, because partial ply separation is prevented, and the breaking of film due to heat at the picking-up does not occur, with the result that chips can be picked up easily and without being damaged.

In the styrene/ethylene/butene- or pentene/styrene block copolymer of the present invention, to enlarge the intervals between chips by radial expanding after the curing of the adhesive with irradiation with radiation, preferably the content of the styrene polymer block component (A) is in the range of 10 to 30 wt %, based on the total of said styrene polymer block component (A) and an ethylene/butene copolymer component (B) or an ethylene/pentene copolymer component (C). If the content of the component (A) is too small, since the properties of the copolymer are close to those of a polyethylene, necking is apt to occur, thereby making uniform expanding impossible, so that the intervals between chips cannot be enlarged. If the content of the component (A) is too large, ultraviolet rays cannot transmit through the block copolymer, so that the adhesive force after the irradiation cannot be lowered. As a result failure of picking up occurs, or wafers or chips are contaminated. Further, the rubber-like elasticity is low and it therefore becomes difficult to increase the intervals between chips by radial expanding.

Preferably, the glass transition temperature of the styrene polymer block component (A) is 20° C. or higher, and preferably the glass transition temperature of the ethylene/butene copolymer block component (B) or the ethylene/pentene copolymer block component (C) is −20° C. or below.

In the present invention, as the styrene/ethylene/butene or pentene/styrene block copolymer, use can be made of styrene/ethylene/butene or pentene/styrene block copolymers that are modified by addition of or substitution by 1% or less of a low-molecular compound, such as maleic acid, that contains a functional group, such as a carboxyl group.

In the case of the copolymer of the components (A) and (B), the weight-average molecular weight of the copolymer may be 35,000 to 90,000, preferably 40,000 to 80,000, more preferably 45,000 to 70,000.

In the case of the copolymer of the block components (A) and (C), the weight-average molecular weight may be 150,000 to 500,000, preferably 170,000 to 400,000, more preferably 180,000 to 300,000.

The resin composition of the film forming the center layer of radiation-curable adhesive tape of this embodiment can be shown by the quadrilateral tetragon surrounded by solid lines in FIG. 1. FIG. 1 is a triangular coordinate diagram showing the composition of three constituents, wherein each vertex A, B, and C of the triangle represents 100% of styrene/ethylene/butene or pentene copolymer (component a), 100% of ethylene/acrylic acid-type copolymer (component b), and 100% of polyamide/polyether copolymer (component c), respectively, and points D, E, F, and G each represent a boundary composition. That is, D represents a point of a=15, b=15, and c=70 wt %;

E represents a point of a=15, b=80, and c=5 wt %;

F represents a point of a=45, b=50, and c=5 wt %; and

G represents a point of a=45, b=15, and c=40 wt %; and the quadrilateral tetragon obtained by connecting these points successively shows the range of resin composition by its inner area.

As the styrene/ethylene/butene/styrene block copolymer (SEBS) or styrene/ethylene/pentene/styrene block copolymer (SEPS), use can be made of those copolymers mentioned above as SEBS and SEPS.

In this embodiment, the content of SEBS or SEPS is limited in a range from 15 to 45 wt %, because, when the content is less than 15 wt %, fibrous swarfs are apt to occur at the dicing process, to adhere to chips, and when the content exceeds 45 wt %, the breaking of film due to heat is apt to occur at picking up of chips.

As an ethylene/acrylic acid-type copolymer there can be mentioned copolymers having 5 wt % or more of the acrylic acid constituent (i.e., acrylic acid or an alkyl acrylate), such as an ethylene/acrylic acid copolymer, an ethylene/methyl acrylate copolymer, or an ethylene/ethyl acrylate copolymer; copolymers having 5 wt % or more of the methacrylic acid constituent (i.e., methacrylic acid or an alkyl methacrylate), such as an ethylene/methacrylic acid copolymer, an ethylene/methyl methacrylate copolymer, or an ethylene/ethyl methacrylate copolymer; an ionomer, such as an ethylene/acrylic acid copolymer or an ethylene/methacrylic acid copolymer partially crosslinked with $Na^+$ or $Zn^{2+}$; or a mixture formed by blending the above copolymers.

In the above ethylene/acrylic acid-type copolymers, the breaking of film at the expanding of the adhesive tape or the picking up of chips becomes unlikely to occur according to the order from an ethylene/acrylic acid copolymer or an ethylene/methacrylic acid copolymer, the ethylene/acrylate ester copolymer, an ethylene/methacrylate ester copolymer, to an ionomer.

In this embodiment, the content of ethylene/acrylic acid-type copolymer is limited in a range from 15 to 80 wt %, because, when the content is less than 15 wt %, the failure of picking up of chips increases due to a partial ply separation at the adhesive tape expanding; and when the content exceeds 80 wt %, the breaking of film due to heat is apt to occur at the picking-up of chips, or the necking of the adhesive tape is apt to occur, which necking sometimes results in the breaking of films at the elongated part by a concentrated stress at the time of expanding. Further, other effects, such that the compatibility of styrene/ethylene/butene or pentene block copolymer with polyamide/polyether copolymer, and the transmittance of radiation, both become better, can be attained by containing ethylene/acrylic acid-type copolymer. In addition, there is no fear of contamination of wafer, because a compatibilizing agent is not needed in this resin composition.

Polyamide/polyether copolymer includes any type of copolymer, with a preference given to a block copolymer in view of tensile strength. It is required that the degree of elongation is 150 wt % or more. Herein "polyamide" means a homopolyamide and a copolyamide having lactam as a main component, for example represented by polycaproamide, polyundecaneamide, and polydodecanamide; it also means a homopolyamide and a copolyamide having ω-aminocarboxylic as a main component acid; and it means a homopolyamide and a copolyamide having diamine and dicarboxylic acid as a main component, for example represented by polyhexamethyleneadipoamide, polyhexamethylenesebacamide, and polyhexamethylenecapramide. As the polyamide, polydodecanamide is preferable in view of tensile strength. "Polyether" means a polymer of diols, such as polyethylene glycol, polypropylene glycol, polybutylene glycol, and polytetramethylene glycol.

The Shore hardness D is preferably in a range from 30 to 70, more preferably in a range from 40 to 65.

In the resin composition, the content of polyamide/polyether copolymer is limited in a range from 5 to 70 wt %, because, when the content is less than 5 wt %, the breaking of film due to heat at the picking-up of chips is apt to occur, and when the content exceeds 70 wt %, the failure of picking up of chips increases due to a partial ply separation at the film expanding, or fibrous swarfs are apt to occur at the dicing process.

In the resin composition of the film forming the center layer of this embodiment, the content of SEBS or SEPS block copolymer is preferably 22 to 42 wt %, more preferably 27 to 42 wt %; the content of ethylene/acrylic acid-type copolymer is preferably 20 to 55 wt %, more preferably 20 to 35 wt %; and the content of polyamide/polyether copolymer is preferably 20 to 60 wt %, more preferably 30 to 60 wt %.

According to the second embodiment of this invention, the center layer film comprises 15 to 45 wt % of an SEBS block copolymer or an SEPS block copolymer, 10 to 45 wt % of an amorphous poly α-olefin, and 20 to 70 wt % of a polyamide/polyether copolymer.

In this embodiment, excellent effects can be attained, wherein fibrous swarfs are not generated at the dicing; and the adhesive force is high enough to secure semiconductor wafer, and the adhesive force is reduced after irradiation with radiation, with flexibility retained. Further, other effects can be attained wherein the failure of picking up of chips is reduced, because partial ply separation is prevented and the breaking of film due to heat at the picking up does not occur, with the result that chips can be picked up easily and without being damaged.

Figure 2:
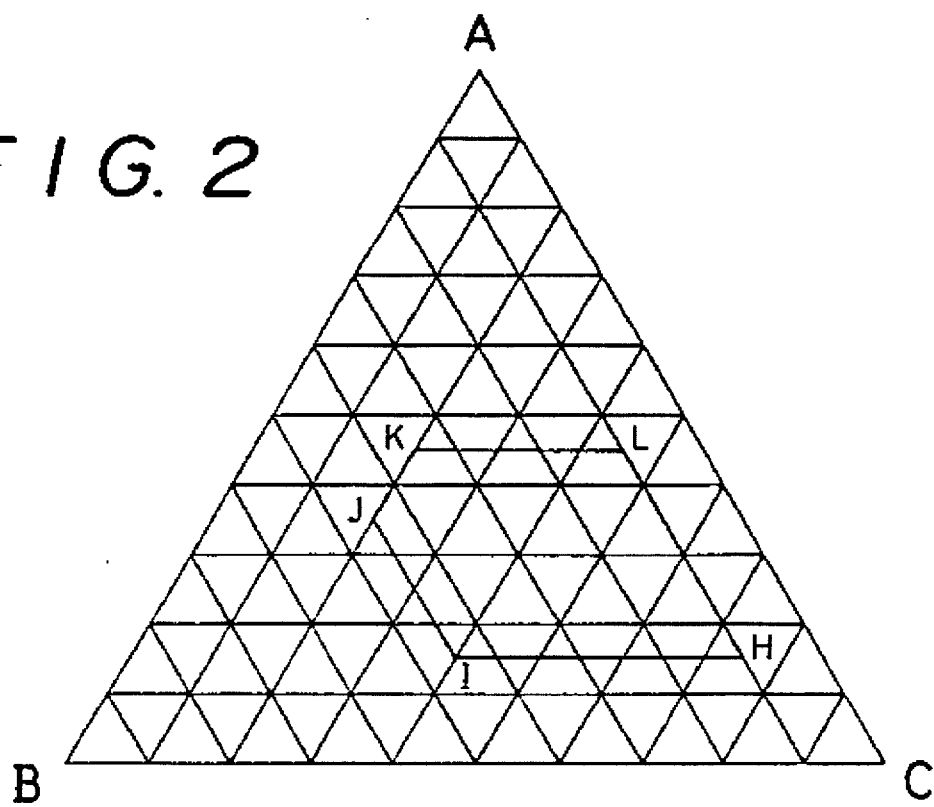

The resin composition of this embodiment can be shown by the pentagon surrounded by solid lines in FIG. 2. FIG. 2 is a triangular-coordinate diagram, like FIG. 1, and each vertex A, B, and C of the triangle has the same meaning as in FIG. 1, except that B represents an amorphous poly α-olefin instead of the ethylene/acrylic acid-type copolymer in FIG. 1. Five points designated by H, I, J, K, and L each represent a boundary composition. That is, H represents a point of a=15, b=10, and c=75 wt %;

I represents a point of a=15, b=45, and c=40 wt %;

J represents a point of a=35, b=45, and c=20 wt %;

K represents a point of a=45, b=35, and c=20 wt %; and

L represents a point of a=45, b=10, and c=45 wt %; and the pentagon obtained by connecting these points successively shows the range of resin composition by its inner area.

In this embodiment, SEBS or SEPS and polyamide/polyether copolymer have the same meanings as mentioned above.

Herein "amorphous poly α-olefin" means a noncrystalline polymer having a relatively low molecular weight, for example, a polymer copolymerized propylene with ethylene or butene-1, for example commercially available APAO (Tradename), produced by UBE-LEXENE, can be mentioned. When a mixture of above-mentioned poly α-olefin with polypropylene is used, the handleability becomes excellent, since blocking is restrained; and when a polymer modified by maleic acid or the like of the above-mentioned resin is used, the compatibility with SEBS or SEPS can be improved.

The content of amorphous poly α-olefin is limited in a range from 10 to 45 wt %, because, when the content is less than 10 wt %, the failure of picking up of chips increases due to a partial ply separation at the film expanding; and when the content exceeds 45 wt %, the breaking of film due to heat is apt to occur at the picking-up chips, or the necking of the adhesive tape is apt to occur, which necking sometimes results in the breaking of films at the elongated part by a concentrated stress at the time of expanding. Further, other effects, such as the compatibility of SEBS or SEPS with polyamide/polyether copolymer, and the transmittance of radiation, both become better, can be attained by containing an amorphous α-olefin. In addition, there is no fear of contamination of wafer, because the compatibilizing agent is not needed in this resin composition.

In the resin composition of this embodiment, the content of SEBS or SEPS block copolymer is preferably 22 to 42 wt %, more preferably 22 to 37 wt %; the content of amorphous poly α-olefin is preferably 10 to 30 wt %, more preferably 11 to 21 wt %; and the content of polyamide/polyether copolymer is preferably 25 to 65 wt %, more preferably 35 to 55 wt %.

Further, in the third embodiment of this invention, the center layer film comprises 15 to 45 wt % of an SEBS or SEPS block copolymer, 15 to 50 wt % of an ethylene/acrylic acid-type copolymer, 3 to 30 wt % of an amorphous poly α-olefin, and 20 to 70 wt % of a polyamide/polyether copolymer.

In this embodiment, the SEBS or SEPS block copolymer, the ethylene/acrylic acid-type copolymer, the amorphous poly α-olefin, and the polyamide/polyether copolymer have the same meanings as mentioned in the above other embodiments.

In this embodiment, excellent effects can be attained, wherein fibrous swarfs are not generated at the dicing; and the adhesive force is high enough to secure the semiconductor wafer, and the adhesive force is reduced after irradiation with radiation, with flexibility retained. Further, other effects can be attained, wherein the failure of picking up of chips is reduced, because partial ply separation is prevented, and the breaking of film due to heat at the picking up does not occur, with the result that chips can be picked up easily and without being damaged.

In the resin composition of center layer film of this embodiment, the content of SEBS or SEPS block copolymer is preferably 16 to 30 wt %, more preferably 17 to 27 wt %; the content of ethylene/acrylic acid-type copolymer is preferably 20 to 45 wt %, more preferably 25 to 40 wt %; the content of amorphous poly α-olefin is preferably 5 to 20 wt %, more preferably 5 to 15 wt %; and the content of polyamide/polyether copolymer is preferably 25 to 50 wt %, more preferably 25 to 40 wt %.

As the process for producing the laminated film of this invention, for example, the conventionally known co-extrusion process or laminating process is used, wherein a bonding adhesive may be interposed between films as is customarily effected in the common production of laminated films. As the bonding adhesive, conventionally known bonding adhesives may be used, such as an ethylene/vinyl acetate copolymer or a maleic acid-modified ethylene/vinyl acetate copolymer.

As the resin to be used in the present invention for the layer for adhesive coating to be applied on the side of the radiation-curable adhesive layer, for example, a resin that can transmit radiation, that hardly contaminates a semiconductor wafer, and that is high in adhesive force to the radiation-curable adhesive, is preferred, such as ethylene series resins, including conventionally known ones, for example a low-density polyethylene, a linear low-density polyethylene, an ethylene/vinyl acetate copolymer, an ethylene/methyl methacrylate copolymer, an ethylene/ethyl methacrylate copolymer, an ethylene/methacrylic acid copolymer, and an ethylene/acrylic acid copolymer, or mixtures of these, which will be selected arbitrarily depending on the adhesion to the radiation-curable adhesive that will be used. This layer for adhesive coating prevents the matter that bleeds from the center layer from contaminating the semiconductor wafer; it also makes greater the adhesive force between the adhesive and the support film, thereby preventing the semiconductor wafer from being contaminated by delamination of the adhesive at the time of expanding of the adhesive tape.

As the resin for the transfer-preventing layer used in the present invention, for example, ethylene series resins are preferred, including conventionally known ones, for example a low-density polyethylene, a linear low-density polyethylene, an ethylene/vinyl acetate copolymer, an ethylene/methyl methacrylate copolymer, an ethylene/ethyl methacrylate copolymer, an ethylene/methacrylic acid copolymer, and an ethylene/acrylic acid copolymer, or mixtures of them. This transfer-preventing layer is a layer that keeps the flexibility of the adhesive tape; it prevents the support film from being blocked; and it prevents, during the storage of the support film or adhesive tape in a rolled state, the matter that bleeds from the center layer from transferring into the radiation-curable adhesive layer or the layer for adhesive coating, which transfer would eventually contaminate the semiconductor wafer.

In order to reduce the friction between the adhesive tape and a mount table at the time of expanding of the adhesive tape, and to prevent the support film from the problem of necking, the transfer-preventing layer is made of a low-density polyethylene or an ethylene/vinyl acetate copolymer; and if use is made of an ethylene/vinyl acetate copolymer, preferably it has a vinyl acetate content of up to 5 wt %. As the bonding adhesive for bonding the center layer to the adhesive coat layer or the transfer-preventing layer, use can be made of conventionally known bonding adhesive, such as an ethylene/vinyl acetate copolymer, a maleic acid-modified ethylene/vinyl acetate copolymer, a maleic acid-modified ethylene/α-olefin copolymer, and a copolymer polyester resin, as well as mixtures of these.

The ethylene/vinyl acetate copolymer and the maleic acid-modified ethylene/vinyl acetate copolymer used as the bonding adhesive, each has preferably a vinyl acetate content of 20% or more, so that the adhesive force is high and delamination (ply separation) hardly occurs. As the process for the production of the laminated film, a known process, such as the co-extrusion process or the laminating process, is used.

Suitably the thickness of the support film is generally 30 to 300 μm, in view of the strength/elongation properties and radiation-transmitting properties desired. Although the ratio of the thickness of the center layer is set arbitrarily depending on the properties required for the support film, generally the ratio of the thickness of the center layer is preferably 30% or more, more preferably 50 to 90%, for the total thickness of the support film. If both a layer for the adhesive coating layer and a transfer-preventing layer are provided, the structure of the support film becomes symmetrical, and therefore the ends of the support film will not curl, which is preferable in view the handling.

Preferably the side of the support film opposite to the side where the radiation-curable adhesive is applied is embossed or is coated with a lubricant, because blocking can be prevented and the friction between the adhesive tape and a mount table at the time of expanding of the adhesive tape is reduced, thereby preventing necking of the support film.

As the radiation-curable adhesive, for example, a conventionally known adhesive can be used. Preferably use is made of an adhesive containing 100 parts by weight of an acrylic adhesive, 10 to 200 parts by weight of at least one compound selected from the group consisting of cyanurate compounds and isocyanurate compounds that have a carbon-carbon double bond, and 5 to 100 parts by weight of a linear polyester or polyol urethane acrylate that has two carbon-carbon double bonds. The adhesive can retain the rubber-like elasticity of the adhesive layer after irradiation with radiation, so that the effect of retaining the rubber-like elasticity (flexibility) in the adhesive tape after irradiation with radiation is particularly high.

When the semiconductor wafer-securing adhesive tape of the present invention is cured by irradiation with ultraviolet rays, if a photopolymerization initiator, such as isopropyl benzoin ether, isobutyl benzoin ether, benzophenone, Michler's ketone, chlorothioxanthone, dodecylthioxanthone, dimethylthioxanthone, diethylthioxanthone, benzyldimethylketal, $\alpha$-hydroxycyclohexyl phenyl ketone, and 2-hydroxymethylphenylpropane, is added, the cure reaction can be allowed to efficiently proceed to lower the adhesive force for securing the chips, even if the cure reaction time is short or the amount of irradiation with ultraviolet rays is small. If necessary, a radiation-curable silicon acrylate or silicon methacrylate may be added, in order to favorably lower the adhesive force for securing chips after irradiation with radiation. A sequestering agent can also be added to favorably lower the adhesive force for securing chips in the case of specifically treated semiconductor wafer surface coated with a metal substance. Further, a tackifier, a viscosity adjuster, a surface-active agent, other modifiers and conventional additives can be added. The thickness of this radiation-curable adhesive layer is generally 2 to 50 µm.

When the present semiconductor-securing adhesive tape is used in cutting a semiconductor wafer or the like, the adhesive tape has a chip-securing adhesive force high enough to secure chips without allowing chips to come off or to be displaced when the wafer is cut into chips by a rotating circular blade, and further, since the support film is good in transmission of radiation, after the irradiation with radiation the adhesive takes on a three-dimensional structure and the chip-securing adhesive force can be lowered when the chips are picked up. Further, since the adhesive tape retains flexibility and is excellent in expandability after the irradiation with radiation, the tape allows intervals between chips to be enlarged sufficiently and uniformly.

Therefore, there is an excellent effect in that the chips can be picked up easily without being damaged. Since the support film does not contain a chlorine-containing compound, which would harmfully affect the semiconductor wafer, nor does it contain a metal-compound-type stabilizer (such as an inorganic salt, a metal soap, and an organic tin compound), or a plasticizer, or the like, which will contaminate a semiconductor wafer, semiconductor chips will not be contaminated with the radiation-curable adhesive, so that an excellent effect is exhibited in that the yield of the chips is increase.

Further, excellent effects can be attained, wherein the fibrous swarfs are not generated at the dicing. Further, other effects can be attained, wherein the failure of picking up of chips is reduced, because partial ply separation is prevented, and the breaking of film due to heat at the picking up does not occur, with the result that chips can be picked up easily and without being damaged.

Now the present invention will be described with reference to Examples, but the invention is not limited to them.

In the Examples, properties were tested and evaluated as follows:

(1) Adhesive force (g/25 mm)

The adhesive force is an index for checking the extent of the adhesive force for securing chips before and after the irradiation.

An Si wafer having a diameter of 5 inches was adhered to the prepared radiation-curable adhesive tape, and the adhesive force before and after irradiation with ultraviolet rays was measured in accordance with JIS Z-0237 (peeling: at 90°, and peeling strength: at 50 mm/min). Herein, the surface of the wafer to be attached to the adhesive tape was made in a mirror state of the planished surface. The adhesive force was evaluated as follows.

| Before irradiation with UV: | good: $\geq$ 120 (g/25 mm) |
| --- | --- |
| | defective: < 120 (g/25 mm) |
| After irradiation with UV: | good: $\leq$ 30 (g/25 mm) |
| | defective: > 30 (g/25 mm) |

(2) Intervals between chips (µm)

The intervals between chips serve as an index for checking the extent and uniformity of the intervals between chips in machine/traverse directions at the time of expanding of the adhesive tape.

A wafer was cut fully into chips of size 3 mm×3 mm or 6 mm×6 mm; then after the tape was cured with ultraviolet rays, the tape was stretched by a wafer-expansion apparatus (air pressure: 2.0 kg/cm$^2$), and the size of the intervals between the chips in the machine/traverse directions was measured, to evaluate the extent and uniformity of the intervals between the chips. The amount of the intervals between the chips included 40 µm, which was the thickness of the blade used in dicing. The size of the intervals between the chips (q):

q$\geq$200 µm: the image of the chips can be well recognized.

200>q$\geq$100 µm: the image of the chips can be recognized.

100>q$\geq$80 µm: the image of the chips is difficult to recognize.

q<80 µm: the image of the chips is impossible to recognize.

The uniformity:

machine/traverse directions$\leq$1.5: good machine/traverse directions>1.5: defective (3) Contamination of an Si wafer The contamination of an Si wafer is an index for checking the extent of contamination of a semiconductor wafer by the radiation-curable adhesive (the adhesion between the radiation-curable adhesive and the support film); and it is also an index for checking the extent of the presence of compounds that harmfully influence or contaminate the semiconductor wafer.

An Si wafer was secured to a support film that used an acrylic adhesive whose initial adhesive strength to the wafer was 300 to 350 g/width of 25 mm, and whose cured adhesive strength to the wafer was 10 to 15 g/width of 25 mm, and which had been rolled and stored, at 40° C., and the contamination of the Si wafer was evaluated according to the following criteria. Among the criteria shown below, "≧4 W" is acceptable.

≧4W: not contaminated even after 4 weeks
3W: not contaminated for 3 weeks
2W: not contaminated for 2 weeks
1W: not contaminated for 1 week
<1W: contaminated before 1 week (4) Strength at expanding of film
Strength at expanding of film was measured with JIS No. 3 dumbbell specimen at tensile speed of 50 mm/min.
○: not broken (0.7 kg/mm$^2$ or over)
X: broken (less than 0.7 kg/mm$^2$)
(5) Fibrous swarfs
Chips were removed from the tape after dicing and were observed from the side of support film.
Photographs were taken at 40 magnifications.
○: no fibrous swarfs were observed
X: some fibrous swarfs were observed
(6) Strength at picking up of chips
Strength at picking up of chips was measured with JIS No. 3 dumbbell specimen at a tensile speed of 50 mm/min, at a temperature of 80° C.
○: not broken (0.5 kg/mm$^2$ or over)
X: broken (less than 0.5 kg/mm$^2$)
(7) Ply separation
Ply separation was measured at a peel angle of 90° and at a peel speed of 5 mm/min.
○: ply did not separate, but material broke
X: ply separated
(8) Fraction of defective chips (Contamination of an Si wafer):
The numbers of chips with adherence of swarf of 100 μm or more in length were recorded. A number less than 5 in 10,000 chips picked up is acceptable.
(9) Failure of picking up of chips
The number of picking-up failures was recorded. A number less than 5 per 5 wafers of 5 inches (10,000 chips) is acceptable. This ratio becomes large when the image identification is difficult due to small intervals between chips or when chips do not release from support film due to a ply separation.

EXAMPLES 1 TO 7 AND COMPARATIVE EXAMPLES 1 TO 8

Support films having the layer constitutions shown in Table 1 were prepared by co-extruding single resins or kneaded blend compositions through an extruder. The thickness of all the support films was 100 μm. The surface of each of the obtained support films on the side where the adhesive coat was applied was subjected to corona treatment, and an adhesive was coated thereon so that the thickness of the adhesive layer after being dried might be 10 μm, thereby preparing each radiation-curable adhesive tape. The physical properties of the adhesive tape were tested as described above and the results are shown in Table 1.

The compounds used in the Examples and Comparative Examples are given below.
Resin I (SEBS):
  KRATON G-1657X, SEBS block copolymer, manufactured by Shell Chemical Company
  styrene: 13%; molecular weight: 80,000
Resin II (Ethylene/acrylic acid-type copolymer):
  Resin II-1 (Ethylene/acrylic acid copolymer)
  PRIMACOL 5980, manufactured by Dow Chemicals
  Resin II-2 (Ethylene/methacrylic acid ionomer crosslinked with Zn ions)
  HIMILAN 1650, manufactured by Mitsui-DuPont Polychemicals.
  Resin II-3 (Ethylene/methyl methacrylate copolymer)
  ACRYFT WD306, manufactured by Sumitomo Chemical Ind. Co. Ltd.
Resin III (Polyamide/polyether copolymer):
  ELY 2742, manufactured by EMS Japan Corporation
Resin U (Polyurethane resin):
  MOBILON F45H, manufactured by Nisshin-Bouseki Co.
Resin A (Polyester elastmer):
  Pelplane P153D, manufactured by Toyobo Co.
Resin B (1,2-Polybutadiene):
  PB840, manufactured by Nihon Gosei Gomu Co.
Resin R (a blend of SEBS block copolymer, having a molecular weight of 100,000 or more and a styrene content of 30% with ethylene-propylene-diene terpolymer):
Adhesive A

| | |
|---|---|
| Acrylic adhesive | 100 pts. wt. |
| Isocyanurate compound | 80 pts. wt. |
| Urethaneacrylate compound | 20 pts. wt. |
| Photopolymerization initiator | 1 pt. wt. |

EVA-10 (ethylene/vinyl acetate copolymer having a vinyl acetate content of 10%):
  EVATATE H 2021 F, manufactured by Sumitomo Chemical Ind. Co., Ltd.
EVA-3 (ethylene/vinyl acetate copolymer having a vinyl acetate content of 3%):
  MITSUBISHI POLYETHY-EVA V 113 K, manufactured by Mitsubishi Petrochemical Co., Ltd.

TABLE 1

| | This Invetion | | | | | | |
|---|---|---|---|---|---|---|---|
| | 1 | 2 | 3 | 4 | 5 | 6 | 7 |
| Support Film Component | | | | | | | |
| Curable Adhesive Layer (10 μm) | Adhesive A | Adhesive A | Adhesive A | Adhesive A | Adhesive A | Adhesive A | Adhesive A |
| Layer for Adhesive Coating (10 μm) | EVA-10 | EVA-10 | EVA-10 | EVA-10 | EVA-10 | EVA-10 | EVA-10 |

TABLE 1-continued

| Center Layer (80 μm) | | | | | | | |
|---|---|---|---|---|---|---|---|
| Resin I (%) | 20 | 20 | 30 | 40 | 40 | 40 | 40 |
| Resin II-1 (%) | 20 | 70 | 40 | 20 | 50 | — | — |
| II-2 (%) | — | — | — | — | — | — | 50 |
| II-3 (%) | — | — | — | — | — | 50 | — |
| Resin III (%) | 60 | 10 | 30 | 40 | 10 | 10 | 10 |
| Resin U, A, B, or R (%) | — | — | — | — | — | — | — |
| Transfer-preventing Layer (10 μm) | EVA-3 | EVA-3 | EVA-3 | EVA-3 | EVA-3 | EVA-3 | EVA-3 |
| Adhesive Force (g/25 mm) Mirror, | | | | | | | |
| Before Irradiation | 280 | 280 | 280 | 280 | 280 | 280 | 280 |
| After Irradiation | 18 | 15 | 17 | 18 | 16 | 16 | 16 |
| Intervals between Chips* Size (μm) | | | | | | | |
| 3 mm × 3 mm | 160 | 160 | 170 | 180 | 180 | 180 | 180 |
| 6 mm × 6 mm | 230 | 230 | 250 | 280 | 280 | 280 | 280 |
| Uniformity | 1.3–1.4 | 1.3–1.4 | 1.3–1.4 | 1.3–1.4 | 1.3–1.4 | 1.3–1.4 | 1.3–1.4 |
| Fibrous Swarfs | ○ | ○ | ○ | ○ | ○ | ○ | ○ |
| Contamination of an Si Wafer | ≧4W | ≧4W | ≧4W | ≧4W | ≧4W | ≧4W | ≧4W |
| Strength at Expanding of Film | ○ | ○ | ○ | ○ | ○ | ○ | ○ |
| Strength at Picking up of Chips | ○ | ○ | ○ | ○ | ○ | ○ | ○ |
| Ply Separation | ○ | ○ | ○ | ○ | ○ | ○ | ○ |
| Failure of Picking up of Chips | 4 | 1 | 2 | 2 | 0 | 0 | 0 |
| Fraction of Defective Chips | 4 | 4 | 3 | 3 | 3 | 3 | 3 |

| | Comparative Example | | | | | | | |
|---|---|---|---|---|---|---|---|---|
| | 1 | 2 | 3 | 4 | 5 | 6 | 7 | 8 |
| Support Film Component | | | | | | | | |
| Curable Adhesive Layer (10 μm) | Adhesive A | Adhesive A | Adhesive A | Adhesive A | Adhesive A | Adhesive A | Adhesive A | Adhesive A |
| Layer for Adhesive Coating (10 μm) | EVA-10 | EVA-10 | EVA-10 | EVA-10 | EVA-10 | EVA-10 | EVA-10 | EVA-10 |
| Center Layer (80 μm) | | | | | | | | |
| Resin I (%) | 0 | 0 | 60 | 100 | 0 | 0 | 0 | 0 |
| Resin II-1 (%) | 0 | 100 | 25 | 0 | 0 | 0 | 0 | 0 |
| II-2 (%) | — | — | — | — | — | — | — | — |
| II-3 (%) | — | — | — | — | — | — | — | — |
| Resin III (%) | 100 | 0 | 15 | 0 | 0 | 0 | 0 | 0 |
| Resin U, A, B, or R (%) | — | — | — | — | R:100 | U:100 | A:100 | B:100 |
| Transfer-preventing Layer (10 μm) | EVA-3 | EVA-3 | EVA-3 | EVA-3 | EVA-3 | EVA-3 | EVA-3 | EVA-3 |
| Adhesive Force (g/25 mm) Mirror, | | | | | | | | |
| Before Irradiation | 280 | 280 | 280 | 280 | 260 | 280 | 280 | 280 |
| After Irradiation | 14 | 14 | 18 | 14 | 14–30 | 50 | 14 | 14 |
| Intervals between Chips Size (μm) | | | | | | | | |
| 3 mm × 3 mm | 150 | 80 | 210 | 220 | 220 | 220 | 130 | 120 |
| 6 mm × 6 mm | 210 | 120 | 300 | 310 | — | — | — | — |
| Uniformity | 1.4–1.5 | 1.4–1.5 | 1.3–1.4 | 1.4–1.5 | 1.4–1.5 | 1.9–2.0 | 1.4–1.5 | 1.4–1.5 |
| Fibrous Swarfs | X | X | ○ | X | ○ | ○ | ○ | ○ |
| Contamination of an Si Wafer | ≧4W | ≧4W | ≧4W | ≧4W | <1W | ≧4W | ≧4W | ≧4W |
| Strength at Expanding of Film | ○ | X | ○ | ○ | ○ | ○ | ○ | ○ |
| Strength at Picking up of Chips | ○ | X | X | X | ○ | ○ | ○ | ○ |
| Ply Separation | X | ○ | ○ | ○ | ○ | ○ | ○ | ○ |
| Failure of Picking up of Chips | 6 | 10 | 0 | 0 | 100< | 15 | 8 | 9 |
| Fraction of Defective Chips | 6 | 6 | 2 | 8 | 3 | 5 | 5 | 5 |

*In case when the tested tape was broken by test of strength at picking up of chips, changes of the test conditions can render the tape not broken.

As is apparent from the results in Table 1, in the Examples of this invention, a semiconductor wafer-securing adhesive tape is obtained wherein adhesive forces both before and after irradiation with radiation are good; the interval between chips after expanding is large enough and uniform; film strengths both at expanding and at picking up of chips, and interlaminer strength, are all good (no breaking and no ply separation); the failure ratio of picking up and the fraction of defective chips are both acceptably small; and fibrous swarfs were not observed; which results mean the adhesive tape can be adaptable for wide-ranging uses. On the contrary, in the Comparative Examples, there are found the breaking of film and not enough enlarging of the interval between chips, and the failure ratio at picking up and the fraction of defective chips are not very good, and fibrous swarfs were observed.

EXAMPLES 8 TO 12 AND COMPARATIVE EXAMPLES 9 TO 12

Radiation-curable adhesive tapes were prepared in the same manner as in Example 1, except that support films having the layer constitutions shown in Table 2 were used. The physical properties of each of the tapes were tested in the same manner as in Example 1, and the results are shown in Table 2.

The compounds used in the Examples and the Comparative Examples are the same as those in Example 1, except that Resin II was changed to Resin V, as described below.
Resin V (amorphous poly α-olefin):
APAO RT 2780, manufactured by UBE-LEXENE.

TABLE 3-continued

|  | This Invention | | |
|---|---|---|---|
|  | 14 | 15 | 16 |
| Resin I (%) | 30 | 30 | 30 |
| Resin II (%) | 31 | 20 | 4 |

TABLE 2

|  | This Invention | | | | | Comparison | | | |
|---|---|---|---|---|---|---|---|---|---|
|  | 8 | 9 | 10 | 11 | 12 | 9 | 10 | 11 | 12 |
| Support Film Constituent |  |  |  |  |  |  |  |  |  |
| Curable Adhesive Layer (10 μm) | Adhesive A | Adhesive A | Adhesive A | Adhesive A | Adhesive A | Adhesive A | Adhesive A | Adhesive A | Adhesive A |
| Layer for Adhesive Coating (10 μm) | EVA-10 | EVA-10 | EVA-10 | EVA-10 | EVA-10 | EVA-10 | EVA-10 | EVA-10 | EVA-10 |
| Center layer (80 μm) |  |  |  |  |  |  |  |  |  |
| Resin I (%) | 20 | 20 | 30 | 35 | 40 | 0 | 20 | 45 | 60 |
| Resin V (%) | 20 | 40 | 25 | 35 | 20 | 0 | 60 | 45 | 20 |
| Resin III (%) | 60 | 40 | 45 | 30 | 40 | 100 | 20 | 10 | 20 |
| Transfer-preventing Layer (10 μm) | EVA-3 | EVA-3 | EVA-3 | EVA-3 | EVA-3 | EVA-3 | EVA-3 | EVA-3 | EVA-3 |
| Adhesive Force (g/25 mm) |  |  |  |  |  |  |  |  |  |
| Mirror, |  |  |  |  |  |  |  |  |  |
| Before Irradiation | 280 | 280 | 280 | 280 | 280 | 280 | 280 | 280 | 280 |
| After Irradiation | 18 | 16 | 18 | 16 | 18 | 14 | 15 | 16 | 18 |
| Intervals between Chips |  |  |  |  |  |  |  |  |  |
| Size (μm) |  |  |  |  |  |  |  |  |  |
| 3 mm × 3 mm | 160 | 160 | 170 | 170 | 180 | 150 | 160 | 190 | 210 |
| 6 mm × 6 mm | 230 | 230 | 250 | 250 | 250 | 210 | 230 | 290 | 300 |
| Uniformity | 1.3–1.4 | 1.3–1.4 | 1.3–1.4 | 1.3–1.4 | 1.3–1.4 | 1.4–1.5 | 1.3–1.4 | 1.3–1.4 | 1.3–1 |
| Fibrous Swarfs | ○ | ○ | ○ | ○ | ○ | X | ○ | ○ | ○ |
| Contamination of an Si Wafer | ≧4W | ≧4W | ≧4W | ≧4W | ≧4W | ≧4W | ≧4W | ≧4W | ≧4W |
| Strength at Expanding | ○ | ○ | ○ | ○ | ○ | ○ | X | ○ | ○ |
| Strength at Picking up of Chips | ○ | ○ | ○ | ○ | ○ | ○ | X | X | X |
| Ply Separation | ○ | ○ | ○ | ○ | ○ | X | ○ | ○ | ○ |
| Failure of Picking up of Chips | 4 | 3 | 3 | 2 | 2 | 6 | 2 | 1 | 0 |
| Fraction of Defective Chips | 4 | 4 | 3 | 3 | 3 | 6 | 4 | 3 | 2 |

As is apparent from the results in Table 2, the semiconductor wafer-securing adhesive tapes of the Examples of this invention show good properties, but, in the Comparative Examples, there are found breaking of film and partial ply separation.

EXAMPLES 13 TO 15

Radiation-curable adhesive tapes were prepared in the same manner as Example 1, except that support films having the layer constitutions shown in Table 3 were used. The physical properties of each of the tapes were tested in the same manner as in Example 1, and the results are shown in Table 3.

TABLE 3

|  | This Invention | | |
|---|---|---|---|
|  | 14 | 15 | 16 |
| Support Film Constituent |  |  |  |
| Curable Adhesive Layer (10 μm) | Adhesive A | Adhesive A | Adhesive A |
| Layer for Adhesive Coating (10 μm) | EVA-10 | EVA-10 | EVA-10 |
| Center layer (80 μm) |  |  |  |

TABLE 3-continued

|  | This Invention | | |
|---|---|---|---|
|  | 14 | 15 | 16 |
| Resin III (%) | 3 | 12 | 22 |
| Resin IV (%) | 36 | 38 | 44 |
| Transfer-preventing Layer(10 μm) | EVA-3 | EVA-3 | EVA-3 |
| Adhesive Force (g/25 mm) |  |  |  |
| Mirror, |  |  |  |
| Before Irradiation | 280 | 280 | 280 |
| After Irradiation | 17 | 17 | 18 |
| Intervals between Chips |  |  |  |
| Size (μm) |  |  |  |
| 3 × 3 mm | 170 | 170 | 170 |
| 6 × 6 mm | 250 | 250 | 250 |
| Uniformity | 1.3–1.4 | 1.3–1.3 | 1.3–1.4 |
| Fibrous Swarfs | ○ | ○ | ○ |
| Contamination of an Si Wafer | ≧4W | ≧4W | ≧4W |
| Expanded State at a Stroke of 30 mm | ○ | ○ | ○ |
| State at Picking up of Chips | ○ | ○ | ○ |
| Ply Separation | ○ | ○ | ○ |
| Failure of Picking up of Chips | 2 | 2 | 3 |
| Fraction of Defective Chips | 3 | 3 | 3 |

17

TABLE 3-continued

|  | This Invention | | |
| --- | --- | --- | --- |
|  | 14 | 15 | 16 |

Note;
Resin I: SEBS block copolymer
Resin II: Ethylene/acrylic acid copolymer
Resin III: Amorphous poly α-olefin
Resin IV: Polyamide/polyether copolymer As is apparent from the results in Table 3, in the Examples of this invention, a semiconductor wafer-securing adhesive tape having excellent properties is obtained.

Having described our invention as related to the present embodiments, it is our intention that the invention not be limited by any of the details of the description, unless otherwise specified, but rather be construed broadly within its spirit and scope as set out in the accompanying claims.

What we claim is:

1. A semiconductor wafer-securing adhesive tape having a radiation-curable adhesive layer on one surface of a support film, wherein the support film is composed of a laminated film that comprises:

(a) as a center layer, a film comprising:

15 to 45 wt % of a styrene/ethylene/butene/styrene block copolymer, wherein the content of the styrene block component is in the range of 10 to 30 wt. percent, based on the total weight of the block copolymer, 15 to 80 wt % of an ethylene/acrylic acid copolymer, an ethylene/methacrylic acid copolymer, an alkyl ester thereof, an ionomer thereof which is partially crosslinked with $Na^+$ or $Zn^{+2}$, or a mixture thereof formed by blending said copolymers, and 5 to 70 wt % of a polyamide/polyether copolymer;

(b) a layer composed of an ethylenic resin as an adhesive coating laid, directly or through a bonding layer, on one surface of the center layer on the side where said radiation-curable adhesive layer is provided; and (c) a transfer-preventing layer composed of an ethylenic resin laid, directly or through a bonding layer, on the other surface of the center layer.

2. A semiconductor wafer-securing adhesive tape having a radiation-curable adhesive layer on one surface of a support film, wherein the support film is composed of a laminated film that comprises, as a center layer, a film comprising 15 to 45 wt % of a styrene/ethylene/butene/styrene block copolymer, wherein the content of the styrene block component is in the range of 10 to 30 wt. percent, based on the total weight of the block copolymer, 10 to 45 wt % of an amorphous poly α-olefin, and 20 to 70 wt % of a polyamide/polyether copolymer; and has a layer composed of an ethylenic resin for adhesive coating laid, directly or through a bonding layer, on one surface of the center layer on the side where said radiation-curable adhesive layer is provided, and has a transfer-preventing layer composed of an ethylenic resin laid, directly or through a bonding layer, on the other surface of the center layer.

3. The semiconductor wafer-securing adhesive tape as claimed in claim 1, wherein the center layer is a film that comprises:

15 to 45 wt % of the styrene/ethylene/butene/styrene block copolymer;

15 to 50 wt % of the ethylene/acrylic acid copolymer, the ethylene/methacrylic acid copolymer, the alkyl ester thereof, the ionomer thereof, or the mixture thereof;

18

3 to 30 wt % of an amorphous poly α-olefin; and 20 to 70 wt % of the polyamide/polyether copolymer.

4. The semiconductor wafer-securing adhesive tape as claimed in claim 1, wherein the ethylene/acrylic acid copolymer is selected from the group consisting of an ethylene/acrylic acid copolymer, an ethylene/methyl acrylate copolymer and an ethylene/ethyl acrylate copolymer; and wherein the ethylene/methacrylic acid copolymer is selected from the group consisting of an ethylene/methacrylic acid copolymer, an ethylene/methacrylic acid ionomer which is partially crosslinked with $Na^+$ or $ZN^{+2}$, an ethylene/methyl methacrylate copolymer and an ethylene/ethyl methacrylate copolymer.

5. The semiconductor wafer-securing adhesive tape as claimed in claim 1, wherein the ethylenic resin of the layer for the adhesive coating is selected from the group consisting of a low-density polyethylene, a linear low-density polyethylene, an ethylene/vinyl acetate copolymer, an ethylene/methyl methacrylate copolymer, an ethylene/ethyl methacrylate copolymer, an ethylene/methacrylic acid copolymer, an ethylene/acrylic acid copolymer and mixtures of these.

6. The semiconductor wafer-securing adhesive tape as claimed in claim 1, wherein the ethylenic resin of the transfer-preventing layer is selected from the group consisting of a low-density polyethylene, a linear low-density polyethylene, an ethylene/vinyl acetate copolymer, an ethylene/methyl methacrylate copolymer, an ethylene/ethyl methacrylate copolymer, an ethylene/methacrylic acid copolymer, an ethylene/acrylic acid copolymer and mixtures of these.

7. A semiconductor wafer-securing adhesive tape having a radiation-curable adhesive layer on one surface of a support film, wherein the support film is composed of a laminated film that comprises:

(a) as a center layer, a film comprising:

15 to 45 wt % of a styrene/ethylene/butene/styrene block copolymer, wherein the content of the styrene block component is in the range of 10 to 30 wt. percent, based on the total weight of the block copolymer, 15 to 80 wt % of a copolymer selected from the group consisting of an ethylene/acrylic acid copolymer, an ethylene/methyl acrylate copolymer, an ethylene/ethyl acrylate copolymer, an ethylene/methacrylic acid copolymer, an ethylene/methyl methacrylate copolymer, an ethylene/ethyl methacrylate copolymer, an ionomer thereof partially crosslinked with $Na^+$ or $Zn^{+2}$, and mixtures thereof formed by blending said copolymers, and 5 to 70 wt % of a polyamide/polyether copolymer;

(b) a layer composed of an ethylenic resin as an adhesive coating laid, directly or through a bonding layer, on one surface of the center layer on the side where said radiation-curable adhesive layer is provided; and (c) a transfer-preventing layer composed of an ethylenic resin laid, directly or through a bonding layer, on the other surface of the center layer.

8. The semiconductor wafer-securing adhesive tape as claimed in claim 7, wherein the center layer is a film that comprises:

15 to 45 wt % of the styrene/ethylene/butene/styrene block copolymer;

15 to 50 wt % of the ethylene/acrylic acid copolymer, the ethylene/methacrylic acid copolymer, the alkyl ester thereof, the ionomer thereof, or the mixture thereof;

3 to 30 wt % of an amorphous poly α-olefin; and 20 to 70 wt % of the polyamide/polyether copolymer.

9. The semiconductor wafer-securing adhesive tape as claimed in claim 7, wherein the ethylenic resin of the layer for the adhesive coating is selected from the group consisting of a low-density polyethylene, a linear low-density polyethylene, an ethylene/vinyl acetate copolymer, an ethylene/methyl methacrylate copolymer, an ethylene/ethyl methacrylate copolymer, an ethylene/methacrylic acid copolymer, an ethylene/acrylic acid copolymer and mixtures of these.

10. The semiconductor wafer-securing adhesive tape as claimed in claim 7, wherein the ethylenic resin of the transfer-preventing layer is selected from the group consisting of a low-density polyethylene, a linear low-density polyethylene, an ethylene/vinyl acetate copolymer, an ethylene/methyl methacrylate copolymer, an ethylene/ethyl methacrylate copolymer, an ethylene/methacrylic acid copolymer, an ethylene/acrylic acid copolymer and mixtures of these.

* * * * *